(12) United States Patent
Blanchard et al.

(10) Patent No.: US 10,510,863 B2
(45) Date of Patent: Dec. 17, 2019

(54) POWER DEVICE HAVING A POLYSILICON-FILLED TRENCH WITH A TAPERED OXIDE THICKNESS

(71) Applicant: MaxPower Semiconductor, Inc., San Jose, CA (US)

(72) Inventors: Richard A. Blanchard, Los Altos, CA (US); Mohamed N. Darwish, Campbell, CA (US); Jun Zeng, Torrance, CA (US)

(73) Assignee: MAXPOWER SEMICONDUCTOR, INC., San Jose, CA (US)

( * ) Notice: Subject to any disclaimer, the term of this patent is extended or adjusted under 35 U.S.C. 154(b) by 0 days.

(21) Appl. No.: 15/676,792

(22) Filed: Aug. 14, 2017

(65) Prior Publication Data

US 2017/0365683 A1    Dec. 21, 2017

Related U.S. Application Data

(63) Continuation of application No. 15/247,510, filed on Aug. 25, 2016, now Pat. No. 9,812,548.
(Continued)

(51) Int. Cl.
*H01L 29/66* (2006.01)
*H01L 29/78* (2006.01)
(Continued)

(52) U.S. Cl.
CPC ...... *H01L 29/66068* (2013.01); *H01L 21/047* (2013.01); *H01L 21/26586* (2013.01);
(Continued)

(58) Field of Classification Search
None
See application file for complete search history.

(56) References Cited

U.S. PATENT DOCUMENTS 7,704,842 B2    4/2010    Blanchard
7,795,661 B2    9/2010    Cheng et al.
(Continued)

OTHER PUBLICATIONS

Kobayashi et al., "100 V Class Multiple Stepped Oxide Field Plate Trench MOSFET (MSO-FP-MOSFET) Aimed to Ultimate Structure Realization" Proceedings of the 27th International Symposium on Power Semiconductor Devices & IC's, May 10-14, 2015, pp. 141-144, Hong Kong.
(Continued)

*Primary Examiner* — Daniel Whalen
(74) *Attorney, Agent, or Firm* — Patent Law Group LLP; Brian D. Ogonowsky

(57) ABSTRACT

In one embodiment, a power MOSFET vertically conducts current. A bottom electrode may be connected to a positive voltage, and a top electrode may be connected to a low voltage, such as a load connected to ground. A gate and/or a field plate, such as polysilicon, is within a trench. The trench has a tapered oxide layer insulating the polysilicon from the silicon walls. The oxide is much thicker near the bottom of the trench than near the top to increase the breakdown voltage. The tapered oxide is formed by implanting nitrogen into the trench walls to form a tapered nitrogen dopant concentration. This forms a tapered silicon nitride layer after an anneal. The tapered silicon nitride variably inhibits oxide growth in a subsequent oxidation step.

19 Claims, 11 Drawing Sheets

Related U.S. Application Data

(60) Provisional application No. 62/215,563, filed on Sep. 8, 2015, provisional application No. 62/218,375, filed on Sep. 14, 2015.

(51) Int. Cl.

| | | |
|---|---|---|
| *H01L 29/40* | (2006.01) | |
| *H01L 29/10* | (2006.01) | |
| *H01L 29/06* | (2006.01) | |
| *H01L 29/16* | (2006.01) | |
| *H01L 21/04* | (2006.01) | |
| *H01L 21/265* | (2006.01) | |
| *H01L 29/423* | (2006.01) | |
| *H01L 29/08* | (2006.01) | |
| *H01L 29/417* | (2006.01) | |

(52) U.S. Cl.
CPC ...... *H01L 29/0623* (2013.01); *H01L 29/0634* (2013.01); *H01L 29/0878* (2013.01); *H01L 29/1037* (2013.01); *H01L 29/1095* (2013.01); *H01L 29/16* (2013.01); *H01L 29/407* (2013.01); *H01L 29/42368* (2013.01); *H01L 29/66734* (2013.01); *H01L 29/7813* (2013.01); H01L 29/1608 (2013.01); H01L 29/41766 (2013.01)

(56) References Cited

U.S. PATENT DOCUMENTS

| | | |
|---|---|---|
| 2003/0168687 A1 | 9/2003 | Chidambarrao et al. |
| 2003/0235959 A1 | 12/2003 | Lichtenberger et al. |
| 2007/0141836 A1 | 6/2007 | Yamauchi et al. |
| 2010/0044791 A1 | 2/2010 | Hebert |
| 2011/0309333 A1 | 12/2011 | Cheng et al. |
| 2016/0093719 A1* | 3/2016 | Kobayashi ........ H01L 21/28008 257/330 |

OTHER PUBLICATIONS

Schott et al., "Blocking of Silicon Oxidation by Low-Dose Nitrogen Implantation" Applied Physics A, Sep. 16, 1987, pp. 73-74.

PCT/US16/49901, EPO as ISA, "International Search Report and Written Opinion", dated Nov. 29, 2016, 9 pages.

\* cited by examiner

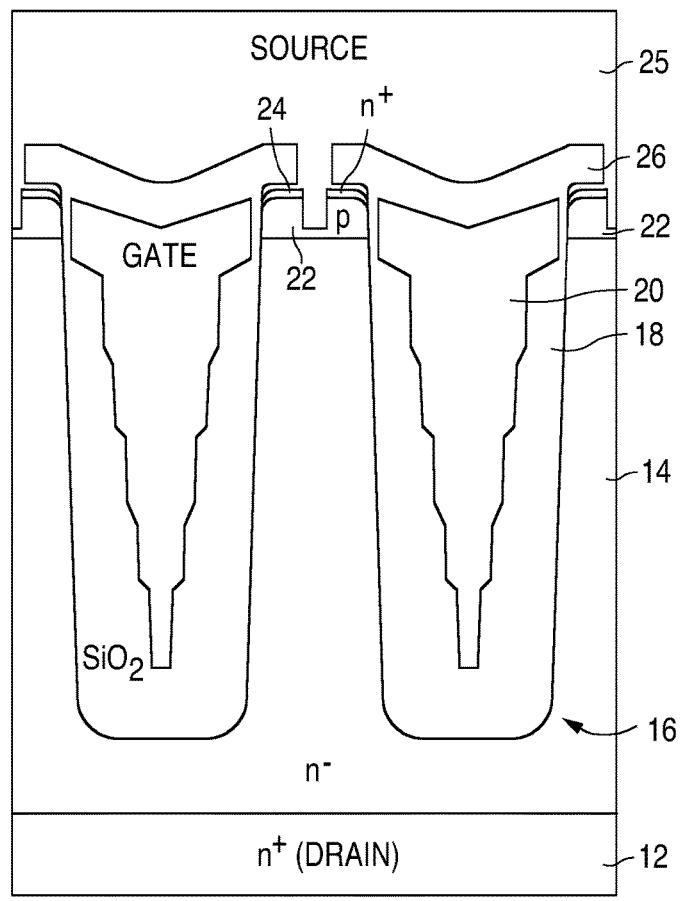
FIG. 1
(PRIOR ART)
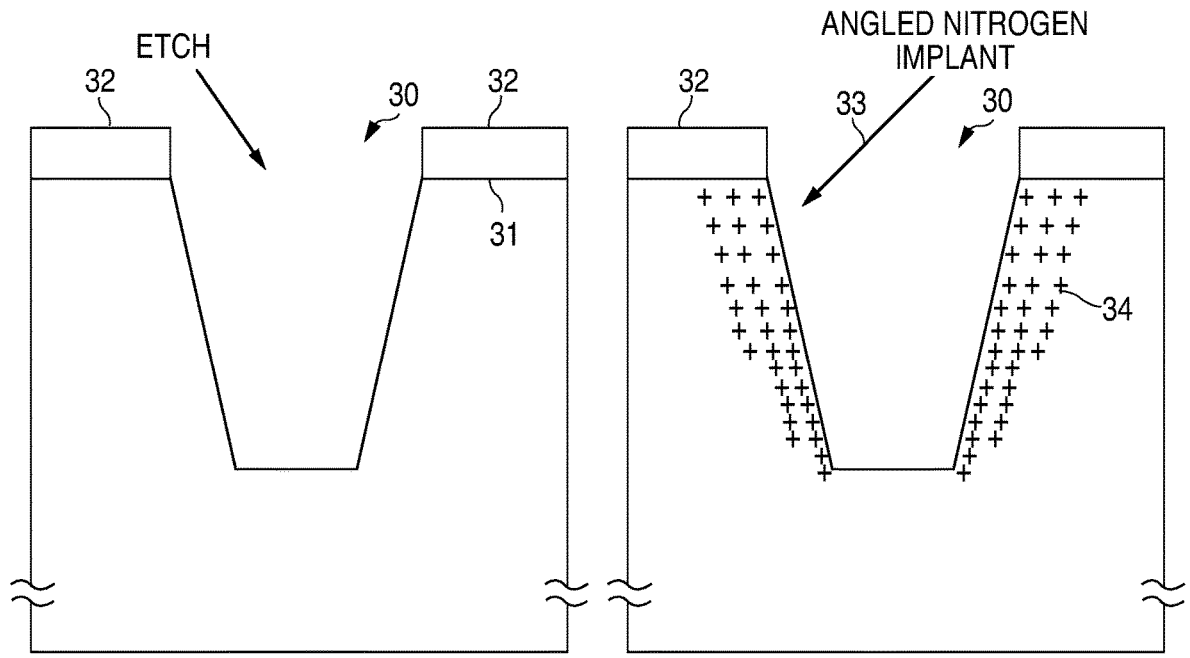
FIG. 2  FIG. 3

POWER DEVICE HAVING A POLYSILICON-FILLED TRENCH WITH A TAPERED OXIDE THICKNESS

CROSS REFERENCE TO RELATED APPLICATIONS

This application is a continuation of U.S. patent application Ser. No. 15/247,510, filed Aug. 25, 2016, which claims priority from U.S. provisional application Ser. No. 62/218,375, filed Sep. 14, 2015, by Richard A. Blanchard et al., and also U.S. provisional application Ser. No. 62/215,563, filed Sep. 8, 2015, by Richard A. Blanchard et al., assigned to the present assignee and incorporated herein by reference.

FIELD OF INVENTION

The present invention relates to trenched gate devices, such as certain vertical or lateral MOS-gated devices, and, in particular, to techniques used to form trenches having a tapered oxide thickness, where the oxide is thicker near the bottom of the trench, for increased breakdown voltage and lower capacitance. The tapered oxide can also be used for trenched field plates.

BACKGROUND

Vertical MOSFETs using trenched gates are popular as high voltage, high power transistors due to their relatively thick, low dopant concentration drift layer which enables a high breakdown voltage in the off state. Typically, the MOSFET includes a highly doped n-type substrate, a thick low dopant concentration n-type drift region, a p-type body formed in the drift region, an n-type source at the top of the body, and a vertical (trenched) gate separated from the channel region by a thin gate oxide. A source electrode is formed on the top surface, and a drain electrode is formed on the bottom surface of the substrate. When the gate is sufficiently positive with respect to the source, a vertical region in the p-type body between the n-type source and the n-type drift region inverts to create a conductive path, or channel, between the source and drain.

In the MOSFET's off-state, when the gate is shorted to the source or at a negative bias, the drift region depletes, and high breakdown voltages, such as exceeding 600 volts, can be sustained between the source and drain. However, due to the required low doping of the thick drift region, the on-resistance suffers. Increasing the doping of the drift region reduces the on-resistance but lowers the breakdown voltage.

Such conventional vertical MOSFETs use trenches with substantially parallel opposing sides, where a thin gate oxide is grown on the trench walls. The oxide has a substantially equal thickness along the walls. The trench is then filled with a doped polysilicon to form the gate. The filled trenches may also be used as field plates to provide more uniform electric field distribution.

The paper by Kenya Kobayashi et al., entitled "100V Class Multiple Stepped Oxide Field Plate Trench MOSFET (MSO-FP-MOSFET) Aimed to Ultimate Structure Realization" (Proceedings of the 27th International Symposium on Power Semiconductor Devices & IC's, pp. 141-144), describes trenches with a variable thickness oxide layer, where the oxide is thicker towards the bottom of the trench. The trenches are then filled with doped polysilicon. FIG. 1 is reproduced from this paper and shows a vertical MOSFET having an n+ drain 12 (which may be the substrate), an n-drift region 14, generally rectangular trenches 16, tapered oxide 18 lining the trenches 16, doped polysilicon forming gates 20, a p-body 22, an n+ source 24 over the p-body 22, a top source metal layer 25 connected to the n+ source 24 and p-body 22, and an oxide 26 insulating the gates 20 from the source metal layer 25. A gate metal electrode (not shown) is connected to the gates 20. In a typical operation, a positive voltage is applied to the drain 12, and one terminal of a load is connected to the source metal layer 25. Another terminal of the load is connected to ground. When the gate 20 is biased above the threshold level, the p-body 22 inverts to conduct a current vertically between the source 24 and the drain 12. When the gate 20 is shorted to the source metal layer 25, the thick drift region 14 supports the electric field. The relative low doping of the drift region 14 is required for a good breakdown voltage but increases on-resistance. When the gates 20 are shorted to the source metal layer 25, they act as field plates, as described below.

By providing a thicker oxide 18 near the bottom of the trenches 16, where the electric field is highest when the MOSFET is off, the oxide insulation can withstand a higher voltage field, compared to a conventional thin gate oxide. The oxide is thin near the top of the trench 16 next to the channel region (p-body). The grounded gate 20 acts like a field plate to uniformly distribute the electric field in the drift region 14 by laterally depleting the drift region 14, which increases the breakdown voltage. In other words, the depletion region in the drift region 14 (in the mesa) between the trenches 16 is more uniform.

The Kobayashi paper describes how the oxide in the trench 16 is tapered by successively growing new oxide layers in the trench and etching each new oxide layer back to a different depth, so the older oxide layers remaining after each etch add to the overall thickness of the oxide layer at the different depths. This process is very time-consuming and can realistically only be used to form an oxide layer having only a few stepped thicknesses.

New techniques are needed for forming tapered oxides in a trench that do not have the drawbacks of the technique described in the Kobayashi paper.

SUMMARY

Various techniques are described herein that are used to create a tapered (including stepped) oxide layer insulating the walls of a trench formed in a silicon, a SiC, or other silicon-containing wafer. The trench is then filled with a conductive material, such as doped polysilicon. The filled trench may be a gate for controlling the current through a vertical transistor or other device, or act as a field plate for increasing a breakdown voltage.

In one embodiment, a trench is formed in a silicon wafer where the trench has sidewalls that are either vertical or that sloped inward toward the bottom of the trench. Then, nitrogen is implanted into the walls to create a tapered nitrogen dopant concentration along the walls, where the dopant concentration lowers with depth into the trench. By varying the angle of the nitrogen implant during the implantation process, a smooth or stepped taper of the dopant concentration is achieved.

The nitrogen chemically bonds with the silicon during an anneal step to form a tapered layer of silicon nitride. The nitride oxidizes at a much lower rate than silicon. So, during an oxidizing step, the oxide growth near the bottom of the trench is much higher than near the top of the trench, creating a relatively thick oxide near the bottom of the trench and a relatively thin oxide near the top of the trench at the channel region.

The trench is then filled with a doped polysilicon to form a gate or a field plate, or a combination of a gate and a field plate.

The device formed may be a vertical or lateral MOSFET, an IGBT, a thyristor, or other controllable device.

In one embodiment, the substrate has a bottom n+ surface forming a drain (connected to a positive voltage), a thick n-drift region, a p-well/body capable of forming a channel region, and an n+ source (connected to a load) in the p-well/body. If the body portion capable of forming the channel region is vertical, the filled trench along that body region can be used as a vertical gate to invert the body region and form a vertical conductive path (channel) between the source and drain. When the transistor is off, by grounding the gate, the gate acts like a field plate to improve the breakdown voltage.

Alternatively, a top planar gate may overlie a lateral channel region in the p-well/body, and the filled trench surrounds the p-well/body to form field plate rings (electrically connected to the source) that more uniformly distribute the electric field while the transistor is off for increasing the breakdown voltage.

In either embodiment, the thicker oxide at the bottom of the trench is better able to withstand a higher voltage than the thinner oxide near the top of the trench. Therefore, the breakdown voltage is increased. Parasitic capacitance is also reduced by the thicker oxide, so turn-off times are reduced. The thin oxide near the top of the trench may be along the channel region, so the gate characteristics, such as threshold voltage, are not affected by the thicker oxide at the bottom of the trench.

A 25% increase in breakdown voltage may be achieved using this technique.

Accordingly, the tapered oxide in the trench is formed in a way that is much faster and more controllable compared to the technique described in the Kobayashi paper, enabling a smoother taper of the oxide.

BRIEF DESCRIPTION OF THE DRAWINGS

FIG. 1 is a cross-sectional view of a portion of a vertical MOSFET reproduced from the Kobayashi paper.

FIG. 2 is a cross-sectional view of a top portion of an epitaxial layer grown over a silicon substrate, where a trench is formed having tapered sides. The trench may ultimately be used for a gate or a field plate.

FIG. 3 illustrates the trench after a nitrogen ion implantation step and an anneal step (to form silicon nitride), where the nitrogen dopant concentration tapers down with depth into the trench. The tapering can be smooth or stepped.

DETAILED DESCRIPTION

Figure 4:
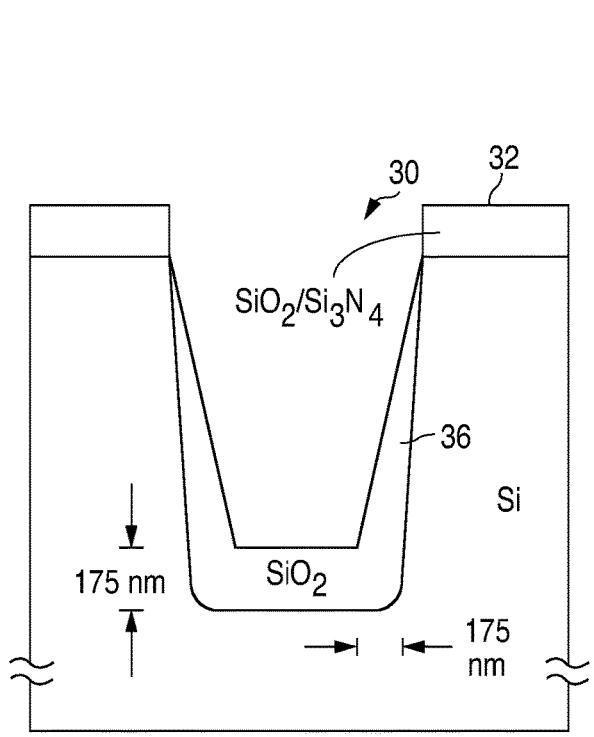
FIG. 4 illustrates the trench after the wafer is subjected to an oxidation step to grow oxide along the walls of the trench, where the nitride inhibits oxide growth, causing the oxide thickness to be tapered.

In one example of a vertical MOSFET formed in accordance with the present invention, the starting substrate is n+ or n++ type. The substrate can be silicon, SiC, or another material containing silicon that can grow an oxide. The wafer will be used to simultaneously form many MOSFETs that are later singulated. Such MOSFETs will typically be high power types, such as one that can withstand 600 volts. A relatively thick n-drift layer is then epitaxially grown over the substrate, where the dopant concentration and thickness depend on the required breakdown voltage.

FIGS. 2-22 illustrate a small portion of the wafer corresponding to a single transistor area (or cell).

FIG. 2 illustrates a trench 30 etched in the top surface 31 of the wafer. The trench 30 may be formed prior to any p-well and n+ source to limit the diffusion of dopants in those regions.

A patterned mask 32, such as nitride, oxide, or a photoresist, exposes the areas of silicon where the trenches 30 are to be formed.

In the example of FIG. 2, the trench 30 is etched using an anisotropic etch, such as RIE, to have tapered sides. Tapered sides enable nitrogen to be more easily implanted with a tapered dopant concentration along the trench sidewalls, as will be later described. The depths of the trenches will typically be a few microns and extend into the drift region of the MOSFET. Forming angled sidewalls of trenches is well known. Some possible techniques include varying the temperature, pressure, and additives during the plasma etching process, as described in the paper, "Trench Etches in Silicon with Controllable Sidewall Angles," by Robert Carlile et al. (Journal of the Electrochemical Society 1988), incorporated herein by reference. An alternative process for forming the angled sidewalls is described in U.S. Pat. No. 5,945,352, incorporated herein by reference. An alternative process for forming angled sidewalls involves tilting the wafer with respect to the incident energized ions (e.g., argon) during the etching process. Other techniques may be used.

In one embodiment, the sidewalls are at an angle of 5-20 degrees with respect to the trench's center line.

In FIG. 3, a nitrogen implant 33 is performed, such as with a dose of $3\times10E15$ ions-cm$^{-2}$, to implant nitrogen ions 34 just below the surface of the trench sidewalls. The implant is performed over a range of angles so that the top portions of the trench 30 have a higher nitrogen dopant concentration compared to the bottom portions of the trench 30. The wafer is then annealed (e.g., at over 1000° C.) in an argon atmosphere to form a tapered silicon nitride layer along the sidewalls.

Implanting nitrogen into a silicon surface for inhibiting oxide growth, such as for forming buried nitride layers and for creating oxide mask layers, is known and described in the paper entitled, "Blocking of Silicon Oxidation by Low-Dose Nitrogen Implantation," by K. Schott et al. (Appl. Phys. A 45, pp 73-76, 1988), incorporated herein by reference. Implanting nitrogen, to Applicant's knowledge, has not been used to create a tapered oxide thickness in a trench for a MOSFET.

Providing angled sidewalls better enables the tilting of the wafer to expose varying areas of the sidewalls to the nitrogen ions. The tilting may be varied smoothly or may be stepped.

As shown in FIG. 4, the wafer is then subject to a dry oxygen atmosphere at an oxidation temperature of about 1020° C. for a time required to grow the tapered oxide 36, such as about 300 minutes. In the example shown, the oxide 36 has a maximum thickness at the bottom of the trench 30 of about 175 nm, down to only about 10 nm at the top of the trench 30 (at the maximum nitrogen concentration), where the thin oxide abuts a channel region.

Figure 5:
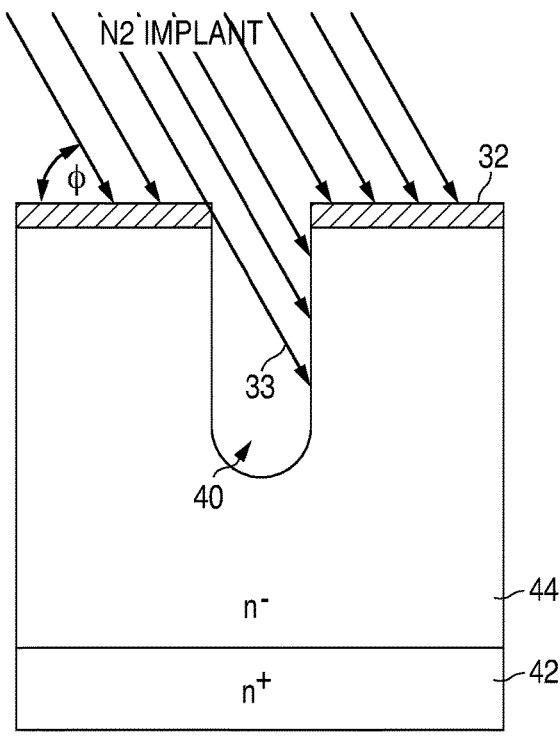
FIG. 5 illustrates nitrogen ($N_2$) ions being implanted at an angle with respect to vertical walls of a trench to achieve a tapered implant.
Figure 6:
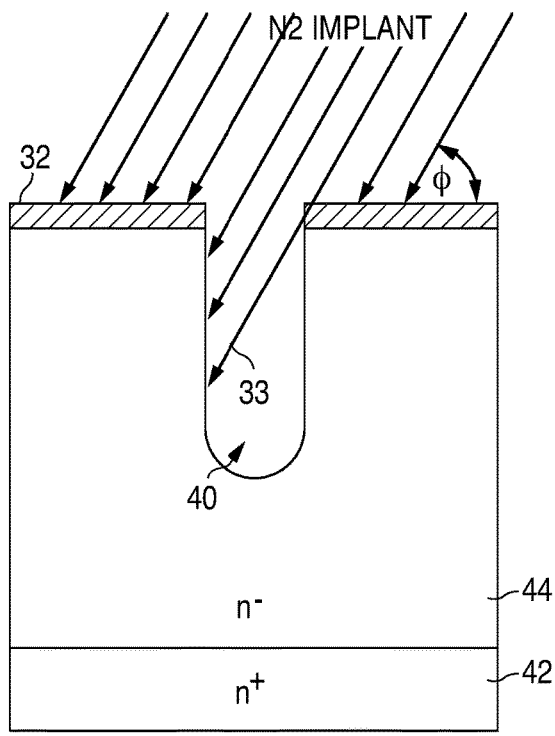
FIG. 6 illustrates nitrogen ($N_2$) ions being implanted at an angle opposite to the angle of FIG. 7 to achieve a tapered implant in the opposite sidewalls. The nitrogen doses may be the same as in FIG. 5 or different.
Figure 7:
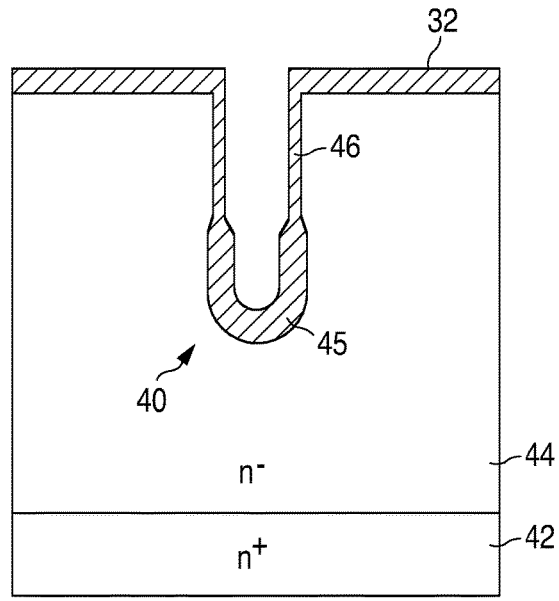
FIG. 7 illustrates the highly stepped, but tapered, oxide grown in the trench of FIGS. 5 and 6. Additional nitrogen implant angles may be used to increase the number of steps or make a smooth taper of the oxide.

FIG. 5-7 illustrate a simplified technique for forming a stepped oxide where the trench 40 has vertical sidewalls. The n+ substrate 42 and n-drift region 44 are shown. In FIG. 5, a nitrogen implant 33 is performed at a first angle, which substantially prevents the implantation of nitrogen below a certain depth into the trench 40. FIG. 6 shows the implantation into the opposite sidewall using an opposite implant angle. Four or more different angled implants may be needed to implant nitrogen in all sidewalls of the trench. After the anneal and oxidation, the resulting oxide in FIG. 7 comprises a thick oxide layer 45 near the bottom of the trench 40 and a thinner oxide layer 46 near the top of the trench 40. Additional implantation angles may be use to form more stepped oxide thicknesses or even a smooth taper.

Figure 8A:
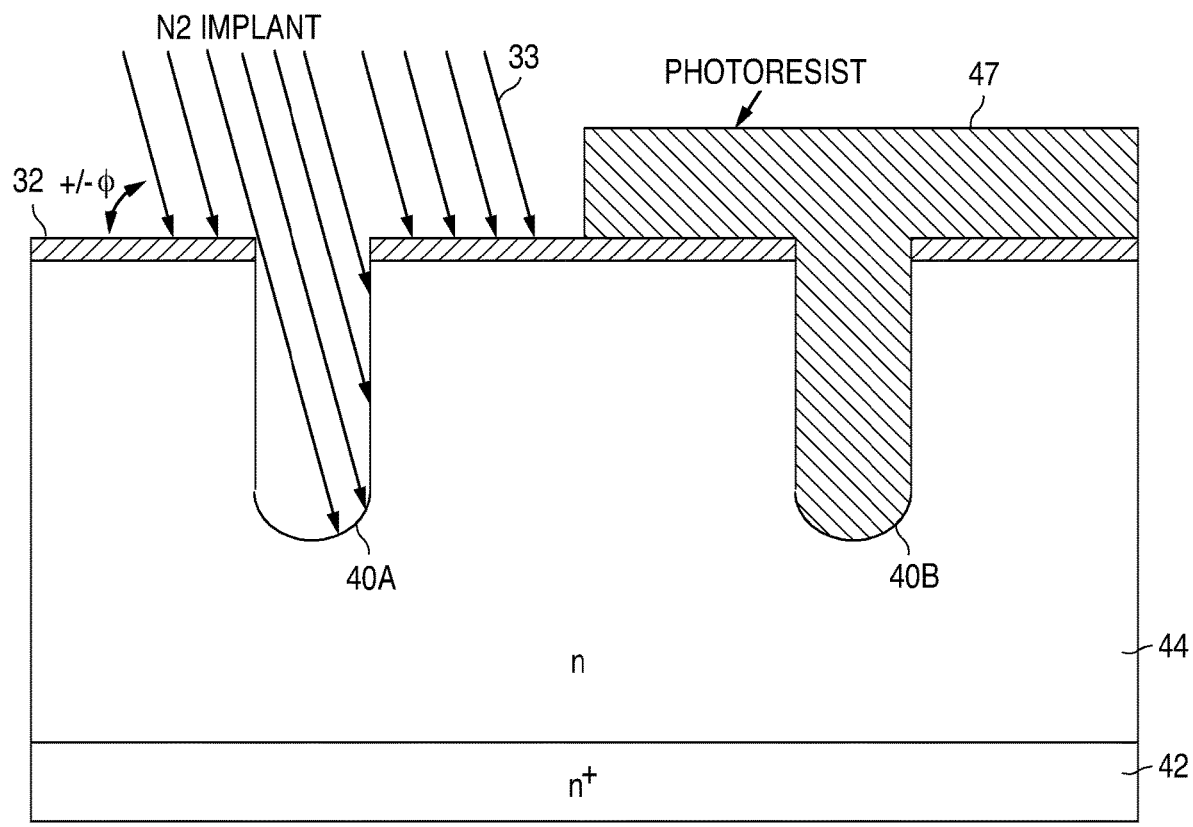
FIG. 8A illustrates a photoresist masking a trench while nitrogen is implanted into another trench in the same substrate.

FIG. 8A illustrates an exposed trench 40A undergoing a nitrogen implant 33, while another trench 40B is masked by a photoresist 47.

Figure 8B:
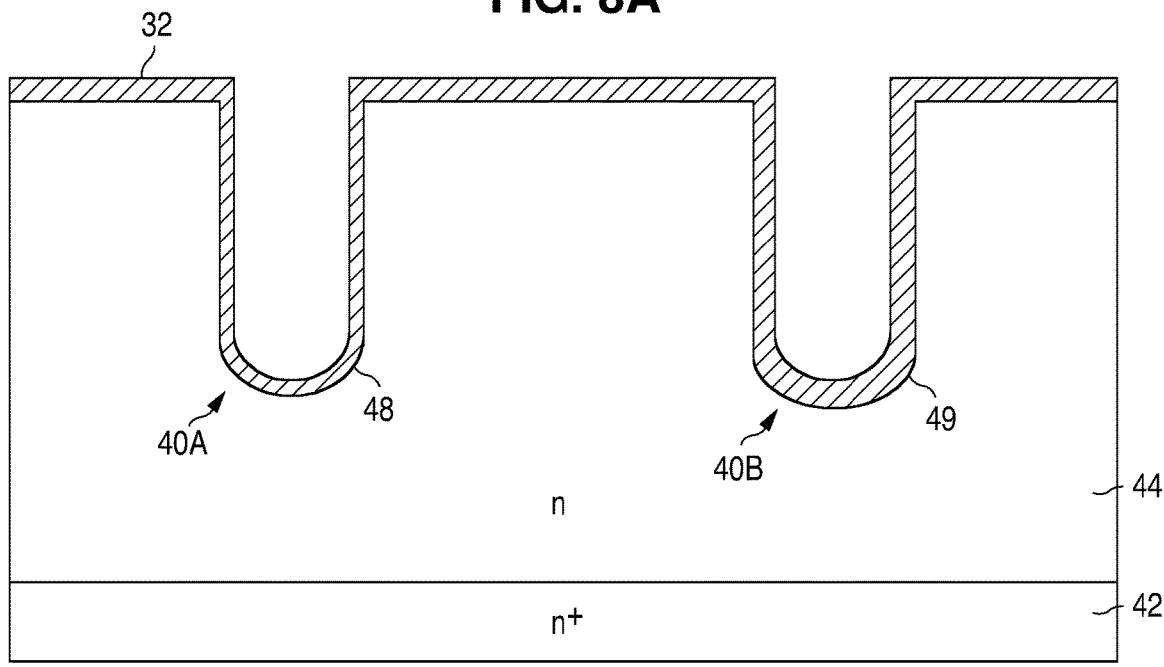
FIG. 8B illustrates the substrate of FIG. 8A after the photoresist is removed and after an oxidation step, showing reduced oxide growth in the nitrogen-doped trench.

FIG. 8B shows the substrate of FIG. 8A after the photoresist 47 is removed, followed by an anneal step and an oxidation step. It is assumed that the nitrogen has been uniformly implanted in the walls of the trench 40A. As a result, the oxide 48 in the trench 40A is much thinner than the oxide 49 in the trench 40B. In certain applications, it is desired to have different oxide thicknesses in trenches in the same die, such as where the trenches perform different functions or are exposed to different electric fields.

Figure 9:
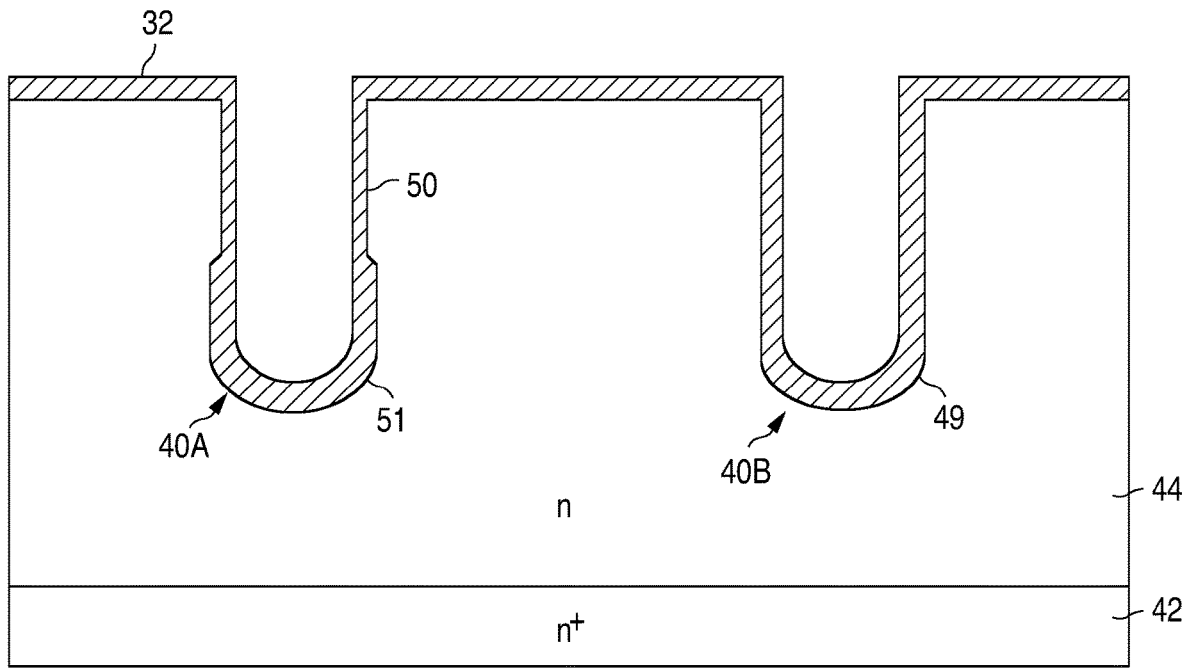
FIG. 9 illustrates a variation of the substrate of FIG. 8A where the nitrogen is implanted at more extreme tilt angles, resulting in a thick bottom oxide and a thinner upper oxide, referred to as a stepped oxide.

FIG. 9 is a variation of FIG. 8A, where the nitrogen implant 33 (FIG. 8A) is performed at a relatively shallow tilt angle for the opposing sidewalls of the trench 40A so the bottom of the trench 40A contains no or little silicon nitride after an anneal step. After an oxidation step, the oxide 50 at the upper portion of the trench 40A is much thinner than the oxide 51 at the bottom of the trench 40A.

The processes described herein thermally grow an oxide in the trenches, since the grown oxide is affected by the silicon nitride in the trench. In another embodiment, a composite thermally grown tapered oxide and a deposited oxide (e.g., using a CVD process for the deposition) are formed in the trench. The deposited oxide is not affected by the nitride and may form a layer of equal thickness. If the grown oxide is tapered, the resulting composite oxide will be tapered.

Figure 10:
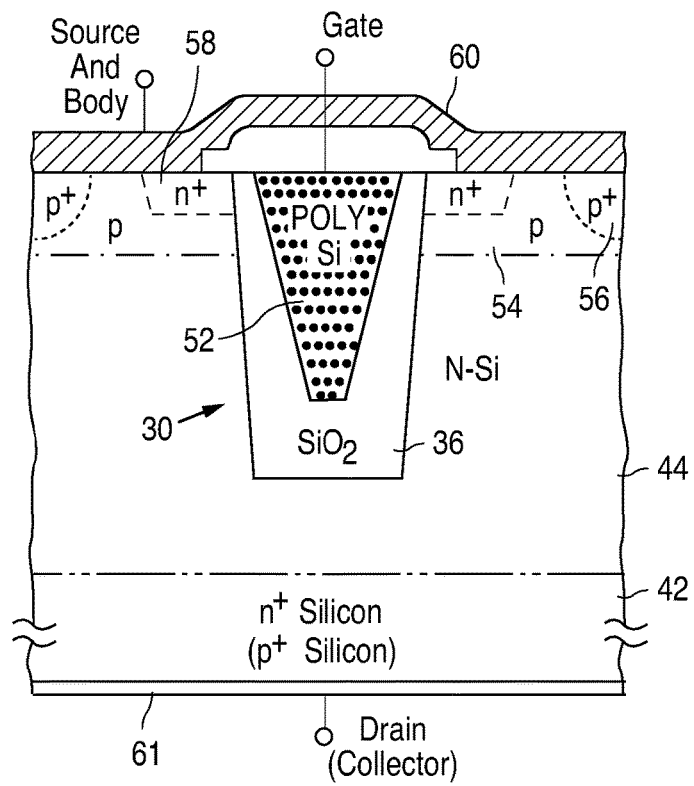
FIG. 10 is a cross-sectional view of an embodiment of a vertical MOSFET or IGBT that uses the filled trench as a gate, where the trench includes a tapered oxide.

FIG. 10 illustrates one possible device that may be formed using the tapered oxide techniques described herein. In FIG. 10, the trench 30 with the tapered oxide 36 is filled with conductive doped polysilicon 52 to form a vertical gate for a MOSFET or IGBT. Assuming an n-channel MOSFET is formed, the substrate 42 (a drain) is an n+ type, and the drift region 44 is n− type. A p-well 54 is formed in the top surface along with a p+ contact region 56 and an n+ source 58. A source metal layer 60 (a source electrode) contacts the p+ contact region 56 and n+ source 58. A drain metal layer 61 (a drain electrode) contacts the bottom of the substrate 42. The substrate 42 may be thinned before forming the drain metal layer 61. A gate metal (not shown) contacts the polysilicon 52 in the trenches. Assuming the drain is connected to a positive voltage and the source is connected to a lower voltage, applying a sufficiently positive voltage to the gate will invert the p-well 54 in the region adjacent to the gate to create a vertical current path. The thin oxide next to the channel region allows for a low threshold voltage. When the MOSFET is in its off state, the much thicker oxide near the bottom of the trench 30 withstands the high electric field deep in the drift region 44 to increase the breakdown voltage of the MOSFET, while the grounded gate (acting as a field plate) laterally depletes the drift region 44.

If the substrate 42 is a p+ type, a vertical PNP bipolar transistor is formed that is turned on by applying the threshold voltage to the gate. The initial flow of current due to the MOSFET action turns on the PNP transistor to conduct current between the top p-type emitter and the bottom p-type collector. That structure is an IGBT.

Figure 11:
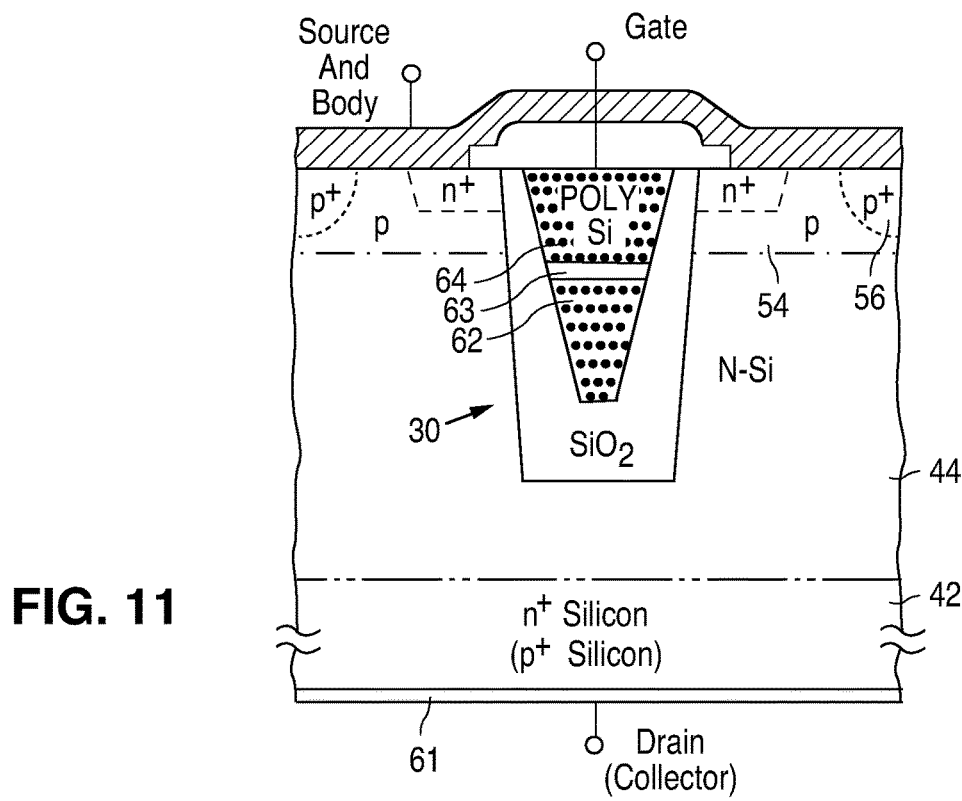
FIG. 11 is a cross-sectional view of an embodiment of a vertical MOSFET or IGBT that uses the filled trench as a gate near the top of the trench, and uses the filled trench as a field plate near the bottom of the trench, where the gate portion and the field plate portion are separate by a layer of oxide.

The polysilicon that fills the trench can also be used as a dedicated field plate. FIG. 11 illustrates the trench 30 where the bottom polysilicon portion forms a field plate 62. The field plate 62 may be connected to the source or is floating. An oxide layer 63 is then formed over the field plate 62 for insulation, and then the remainder of the trench 30 is filled with a polysilicon portion that is connected to the gate metal to act as a gate 64 for the MOSFET or IGBT. If the gate 64 is shorted to the source in the off-state, the gate 64 also acts as a field plate. The field plate laterally depletes the n-type layer 44 when the device is off to increase the breakdown voltage.

In another embodiment, a trenched gate and a trenched field plate may be separately formed, where the trenched field plate surrounds the transistor or cell. The processes used to form the trenched gate and trenched field plate may be identical, so they may be formed simultaneously.

FIGS. 12-22 illustrate MOSFETs where the trenches 30/40 have either angled sidewalls or vertical sidewalls. In either case, a tapered oxide is formed in the trenches and the trenches are then filled with a conductive polysilicon (or other conductive material). In the examples, the primary channel region is on the top surface of the wafer, and the channel region is inverted by a lateral gate 70.

In FIGS. 12-19, 21, and 22, the polysilicon in the trenches 30/40 only acts as a field plate 72. The trenches 30/40 are formed much deeper than the p-well 54 in order for the polysilicon to perform its function as a field plate. The field plate 72 may be shorted to the source metal layer 60, or to the gate 70, or may be floating. The field plate 72 surrounds the MOSFET cell and spreads the electric field to increase the breakdown voltage. The function of a field plate is well known.

Figure 12:
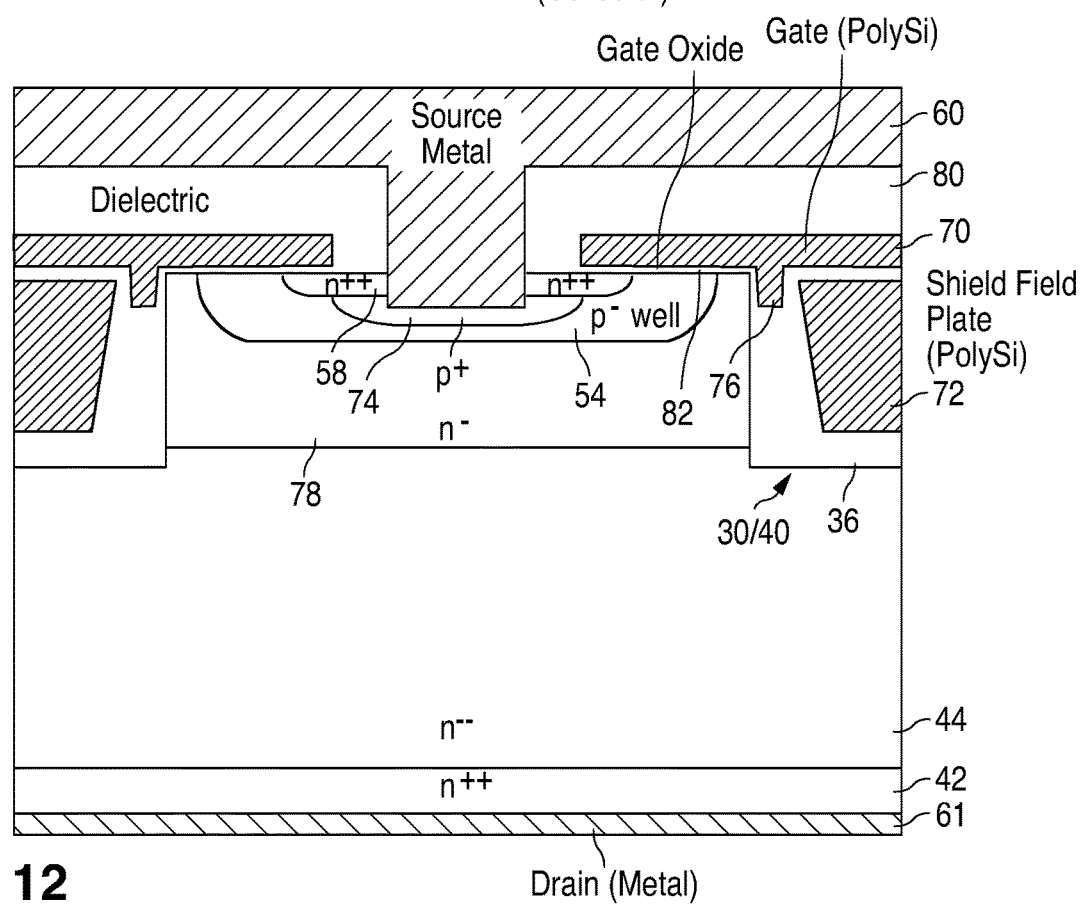
FIGS. 12-19, 21, and 22 are cross-sectional views of a MOSFET where a lateral gate is used to control the current, and where a trenched field plate is used to shape the electric field to increase the breakdown voltage. The field plate may be connected to the source or to the gate, or floating.

FIG. 12 is a cross-sectional view of a single vertical DMOS transistor cell (which may be a portion of a strip) in an array of identical contiguous cells connected in parallel. A p+ contact region 74 contacts the source metal layer 60. The lateral gate 70 includes a vertical extension 76 that enhances the adjacent n− layer 78 to lower on-resistance. A dielectric 80, such as oxide, insulates the source metal layer 60.

In FIG. 12, the width of the cell shown is about 5-15 microns. The cell may have a breakdown voltage exceeding 600 volts, and the number of cells in an array of identical cells determines the current handling ability, such as 20 Amps. The array of cells may be in strips, squares, hexagons, or other known shapes.

In one typical application, the bottom drain metal layer 61 is connected to a positive voltage supply, and the top source metal layer 60 is connected to one terminal of a load. Another terminal of the load is connected to ground. When a positive voltage is applied to the gate 70 that is greater than the threshold voltage, the top surface of the p-well 54 is inverted to create a lateral conductive path through the p-well 54. Additionally, electrons accumulate in the n-layer 78 adjacent to the vertical extension 76 of the gate 70 to spread the current and lower the on-resistance of the n-layer 78. As a result, current is conducted between the source metal layer 60 and the drain metal layer 61.

The vertical extension 76 of the gate 70 may extend below the p-well 54, but there is a tradeoff between reducing the gate-drain capacitance (by reducing its surface area) and reducing on-resistance by extending the vertical extension 76 deeper into the trench 30/40.

In the off-state, the field plate 72 laterally depletes the n-drift region 78, which is more highly doped than the underlying n-drift region 44, to increase the breakdown voltage.

Since the n-drift region 78 becomes depleted, the bottom n-drift region 44 can be made thinner, so on-resistance is reduced. The entire n-drift region 78 is preferably totally depleted at the onset of breakdown. The n-drift region 44 is preferably also totally depleted at the onset of breakdown.

The combination of the lateral DMOS transistor portion, the higher doping of the n layer 78, the vertical extension 76 of the gate 70, and the reduced thickness of the n-drift region 44 reduce the on-resistance compared to the prior art.

The effect of the vertical field plate 72 (connected to the source) also speeds up the switching time if the MOSFETs internal PN diode becomes forward biased then reversed biased.

The gate oxide 82 thickness below the gate 70 and along the vertical extension 76 of the gate 70 is much thinner than the oxide 36 insulating the field plate 72. Since the electric field near the top of the n-drift region 78 is much less than that near the bottom of the n-drift region 78, the oxide can be thinner near the top of the MOSFET without reducing the breakdown voltage.

The effect of the vertical extension 76 of the gate 70 (accumulates electrons along the sidewall) allows a reduction of the p-well-to-trench spacing, enabling a reduction of the cell pitch and active area while still resulting in a lower on-resistance, which results in a lower Rsp. The spacing can be, for example, less than 0.1 to 0.5 of the p-well junction depth. The field plate 72 can be electrically connected to the gate 70 or source metal layer 60 or can be floating. Connecting the field plate 72 to the source metal layer 60 provides a lower gate-drain capacitance or lower gate-drain charge Qgd, while connecting the field plate 72 to the gate 70 results in a lower on-resistance due to the creation of an electron accumulation layer along a longer length of the trench sidewalls when the gate 70 is biased to a positive voltage.

The trench 30/40 may be 2-20 microns deep. The width of the trench 30/40 (between adjacent cells) may be 1-2 microns. The p-well 54 depth may be about 2.5 microns. The thicknesses of the n-drift region 78 and n-drift region 44 are determined based on the desired breakdown voltage and may be determined using simulation.

If the cell is a closed cell, such as a hexagon or square, the vertical extension 76 of the gate 70 and the vertical field plate 72 surround the n-drift region 78. If the cell is a strip, the vertical extension 76 of the gate 70 and the vertical field plate 72 run along the length of the n-drift region 78.

Figure 13:
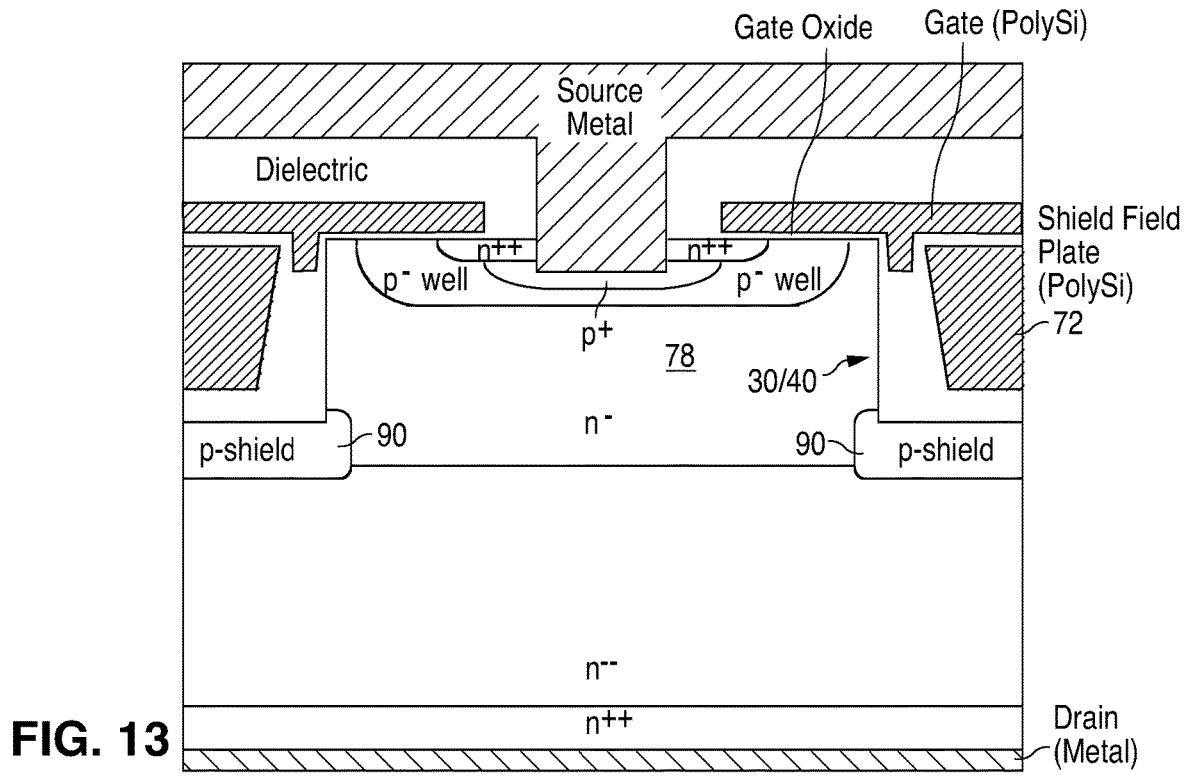

FIG. 13 shows another embodiment similar to that of FIG. 12 but with a self-aligned P-shield region 90 below the trenches 30/40. In the off-state, the device is reversed biased and the p-shield region 90 lowers the electric field under the trench 30/40, since the p-shield 90 is fully depleted prior to breakdown, which results in a higher breakdown voltage. The p-shield region 90 also serves to laterally deplete the n-drift region 78 to further increase the breakdown voltage. The p-shield region 90 can be floating, but to switch the device on from the off state, the parasitic capacitor resulting from the depletion layer between the p-shield region 90 and n-drift regions 78 and 44 has to be discharged. Therefore it is preferable to connect the p-shield region 90 to the source metal layer 60 via the p-well 54 and a p-type connection region in certain locations of the die (not shown). The connection of the p-shield region 90 to the source metal layer 60 provides a path for current to discharge the capacitor and improves the switching delay during switching the device from the off to the on state.

Figure 14:
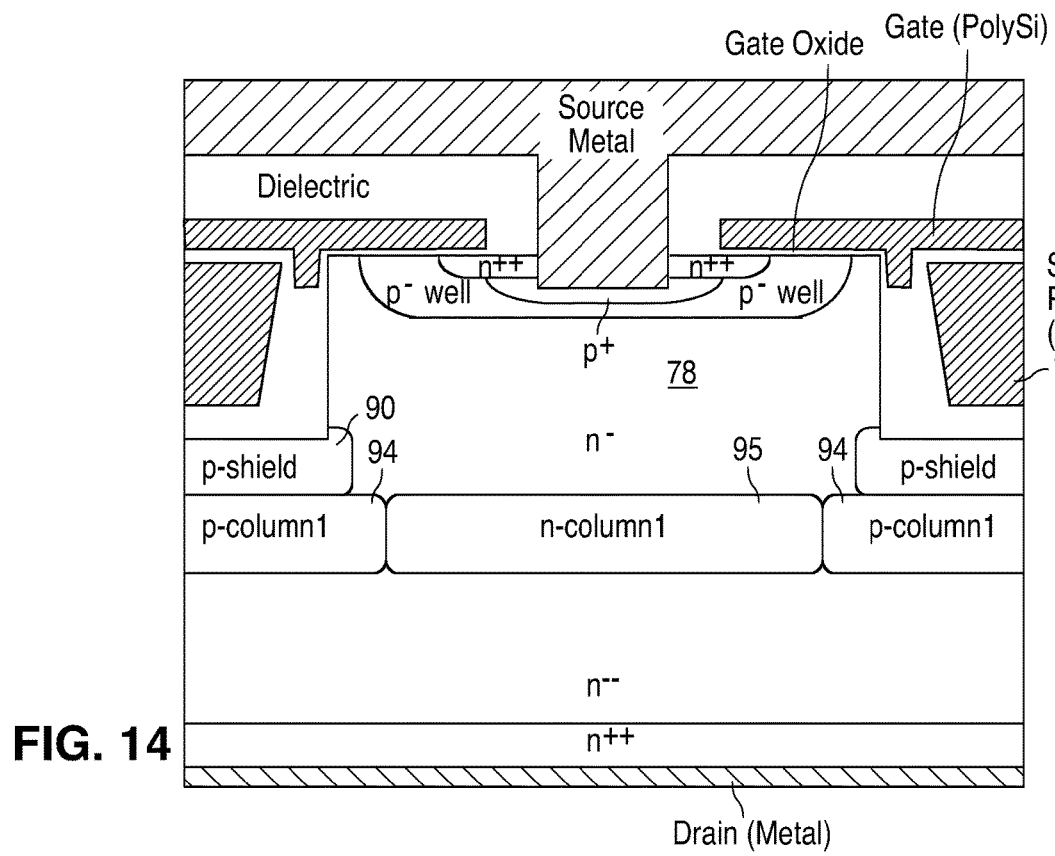

FIG. 14 shows another embodiment similar to that of FIG. 13 but with p and n charge balance columns 94 and 95 to lower the Rsp. The n columns 95 are more highly doped than the n-layer 78 so help reduce on-resistance. The n and p columns 94/95 deplete when the device is off and are preferably fully depleted at the onset of breakdown.

Figure 15:
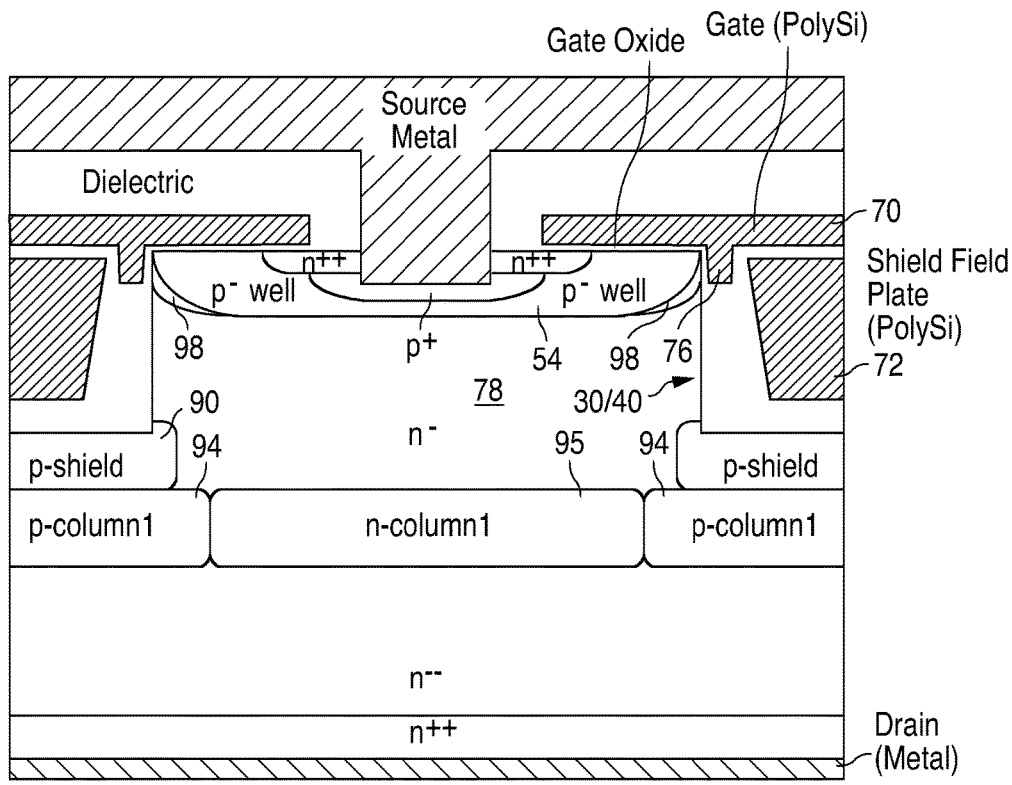

FIG. 15 shows another embodiment similar to that of FIG. 14 but with a self-aligned enhanced n-surface region 98 (n-Surf) surrounding the edge of the p-well 54 and extending to the trench sidewall. The n-surface region 98 has a doping concentration that is higher than the n-layer 78. The vertical extension 76 of the gate 70 accumulates electrons in the n-surface region 98 to further lower its on-resistance. Therefore, the n-surface region 98 provides a lower on-resistance and better current spreading. It is preferred that the p-shield 90 and the p and n columns 94/95 are completely depleted at the onset of avalanche breakdown.

Figure 16:
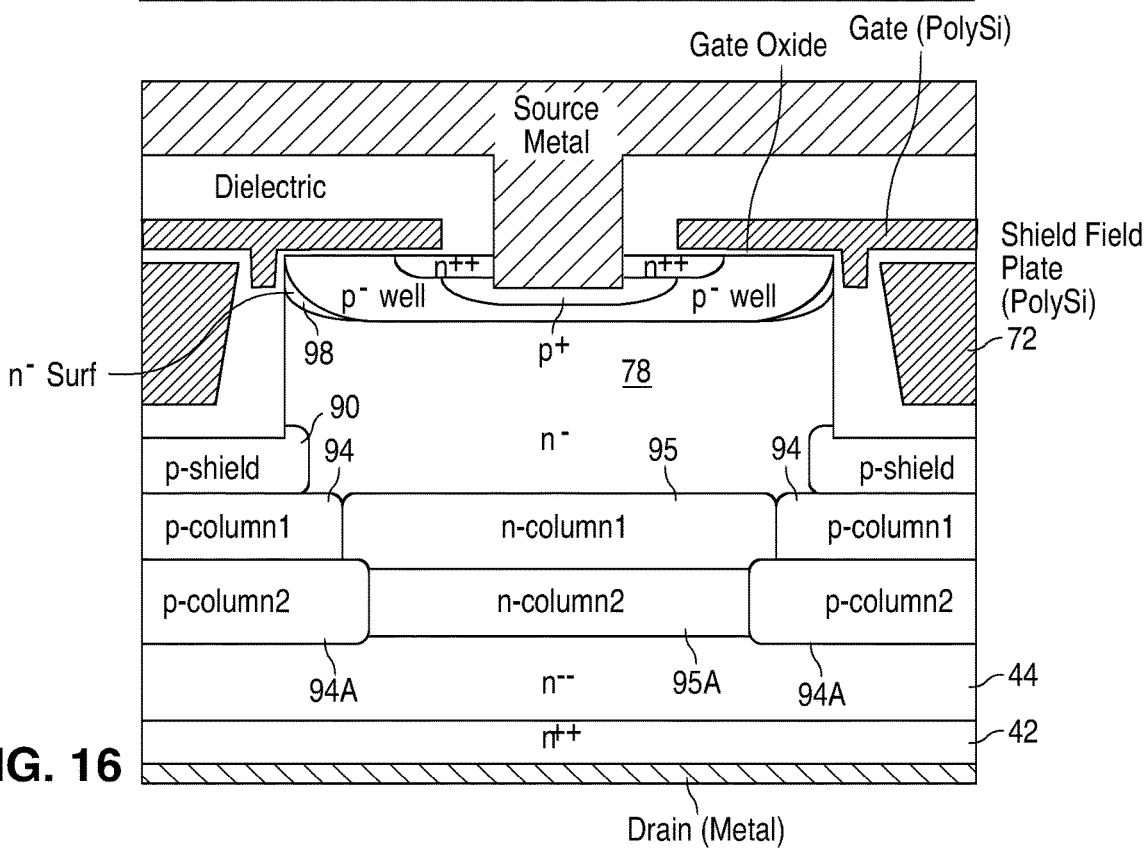

FIG. 16 shows another embodiment similar to that of FIG. 15 but with multiple layers of p and n charge balance columns 94/95, 94A/95A. By forming the p and n columns as multiple "thin" layers, there is less lateral dopant spreading so the columns can be formed more precisely. Note how the lower p-columns 94A are wider than the upper p-columns 94 due to the additional thermal budget. More than two layers of p and n columns can be formed. It is preferred that the p-shield 90, n-columns 95, p-columns 94, n-drift region 78, and n-drift region 44 are fully depleted at the onset of avalanche breakdown.

Figure 17:
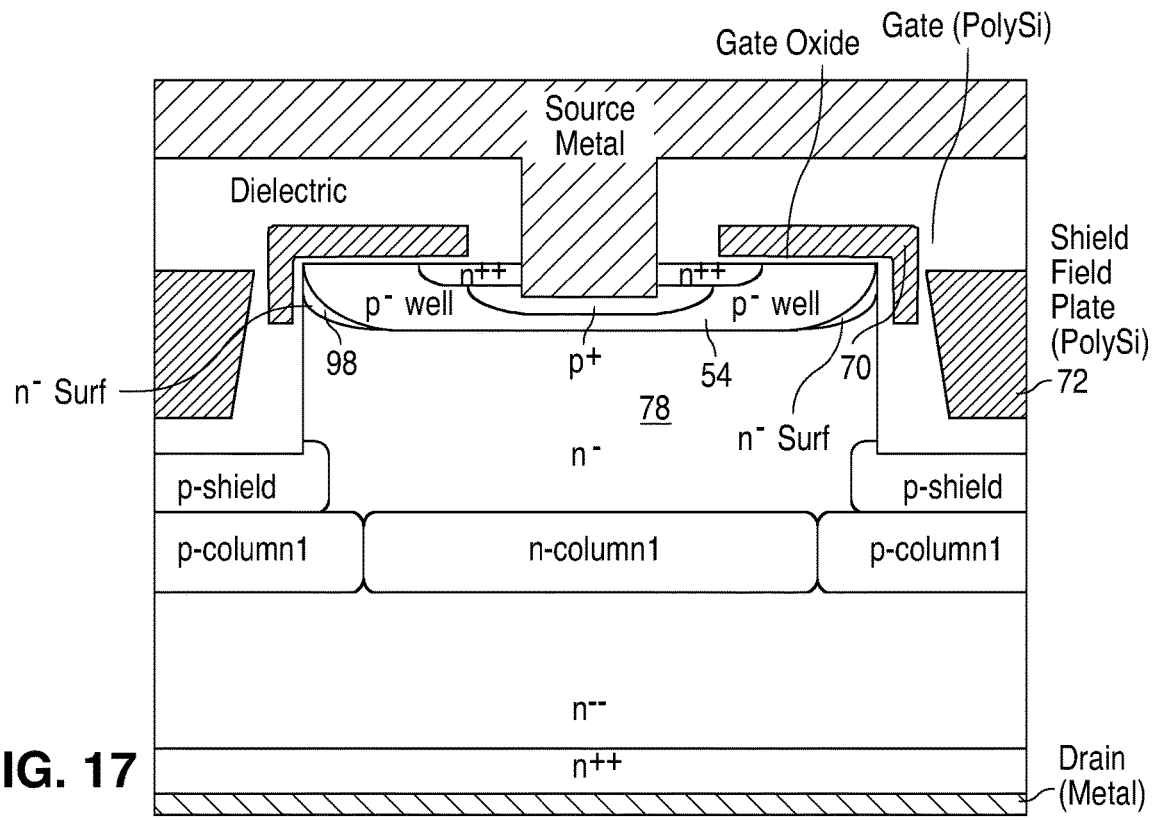

FIG. 17 shows another embodiment similar to that of FIG. 15 but with an L shaped gate 70 for minimizing the overlap of the gate 70 and field plate 72 for a lower gate-drain capacitance to increase switching speeds.

Figure 18:
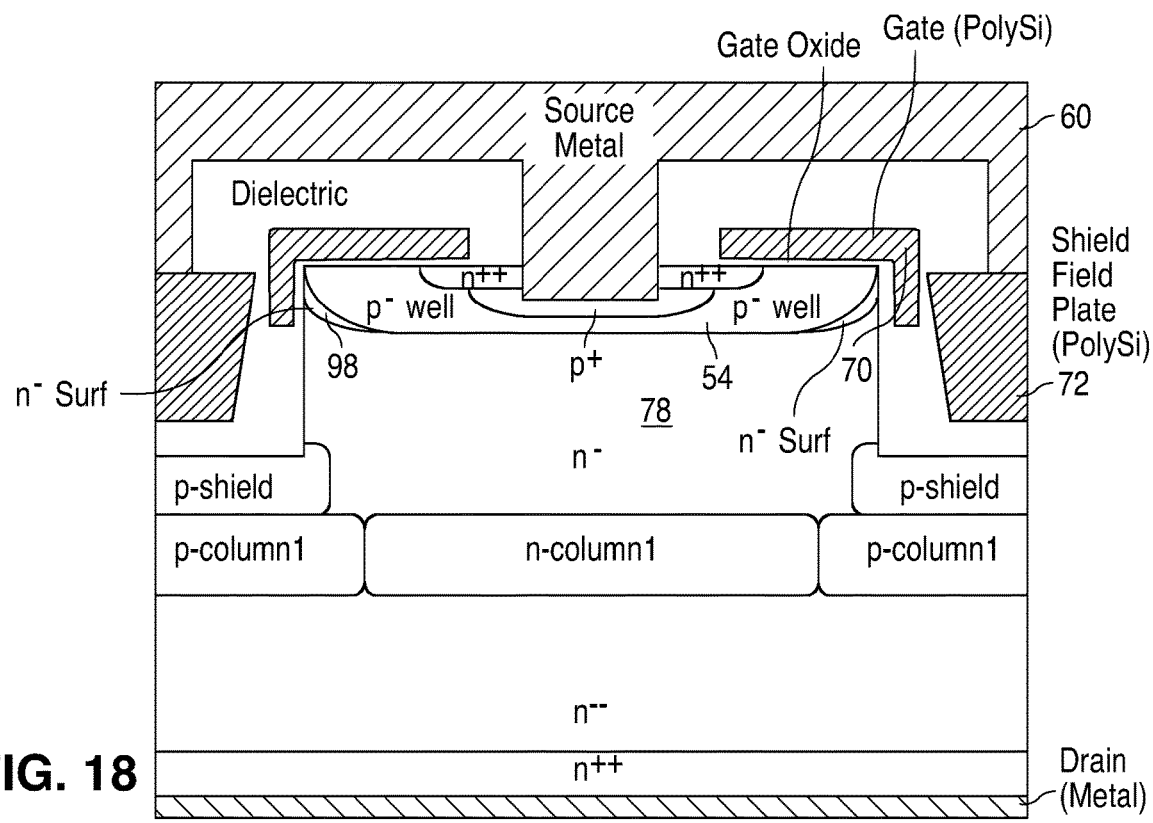

FIG. 18 shows the embodiment of FIG. 17 but through a different cross-section, showing an area where the field plate 72 is electrically connected to the source metal layer 60. In other embodiments, the field plate 72 may be connected to the gate 70 (which would increase capacitance), or floating.

Figure 19:
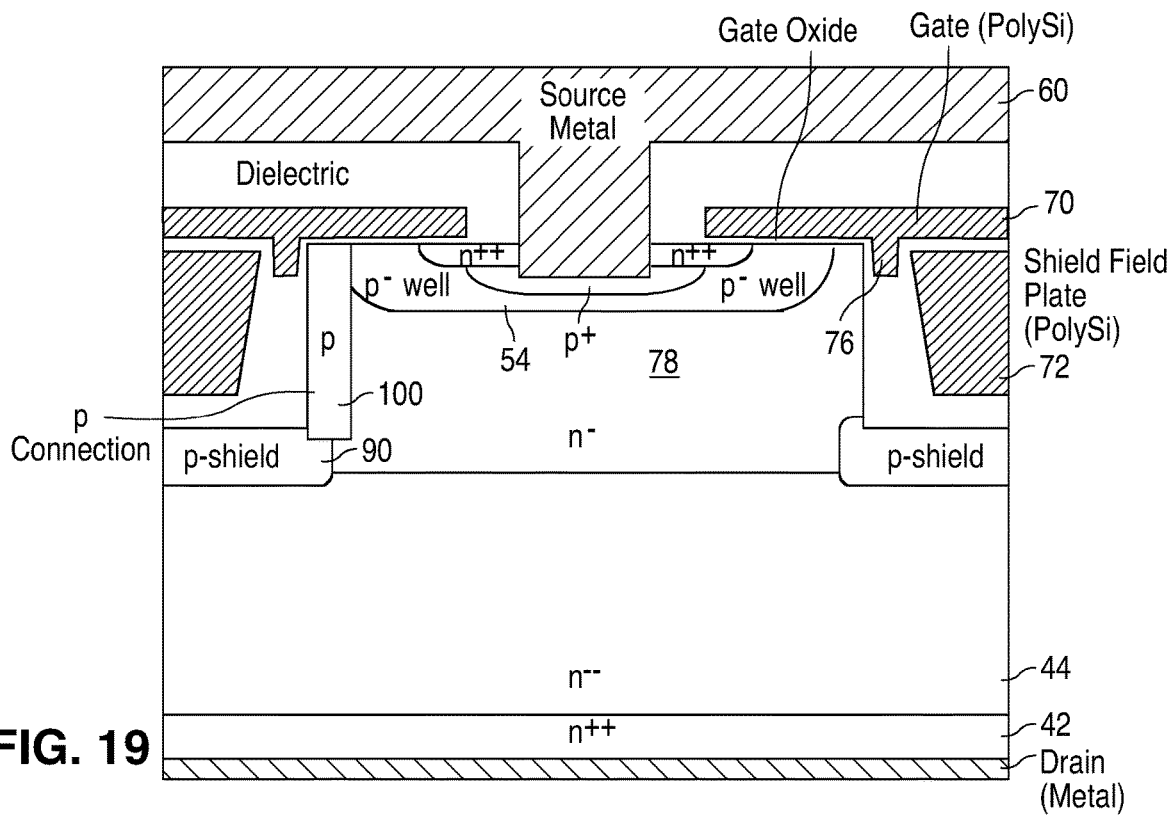

FIG. 19 shows another embodiment similar to that of FIG. 13 but with a p-connection region 100 that electrically connects the p-shield region 90 to the p-well 54 and source metal layer 60 to increase switching speeds.

As in the other embodiments, the vertical extension 76 of the gate 70 can extend any distance into the trench 30/40, including below the p-well 54.

Figure 20:
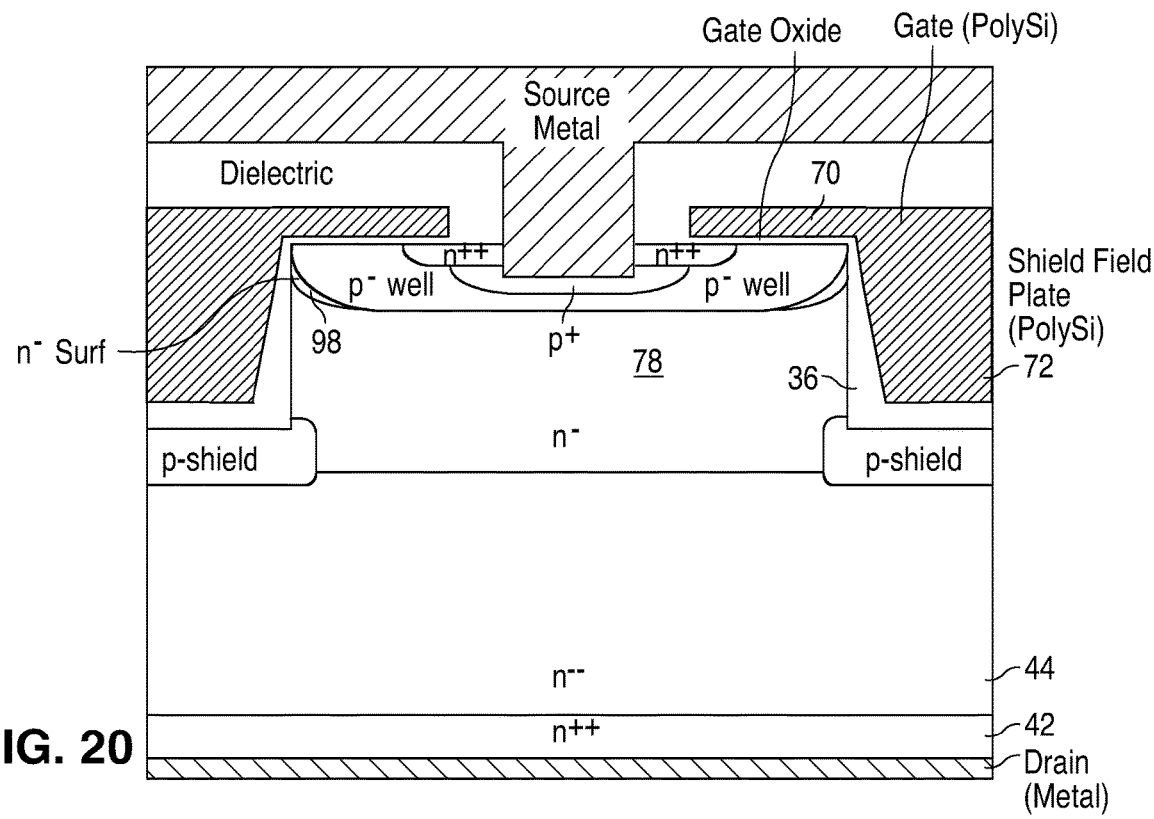
FIG. 20 is a cross-sectional view of a MOSFET, where a lateral gate is used to primarily control the current, and where a trenched vertical gate enhances a vertical portion of the channel region to further control the current and reduce on-resistance. In the off-state, the trenched gate acts as a field plate.

In FIG. 20, the lateral gate polysilicon is connected to the polysilicon that fills the trench 30/40, so the trench polysilicon is at zero volts when the MOSFET is off, assuming the gate is shorted to the source in the off state. Thus, the trench polysilicon acts as a field plate 72 in the off-state but helps to accumulate electrons along the trench sidewall in the n-surface region 98 in the on-state due to the thin (tapered) oxide 36 in the trench near the channel region. Since the voltage is much less near the top of the trench 30/40, the oxide 36 thickness near the top of the trench 30/40 (across from the p-well 54) can be much less that that near the bottom of the trench.

Figure 21:
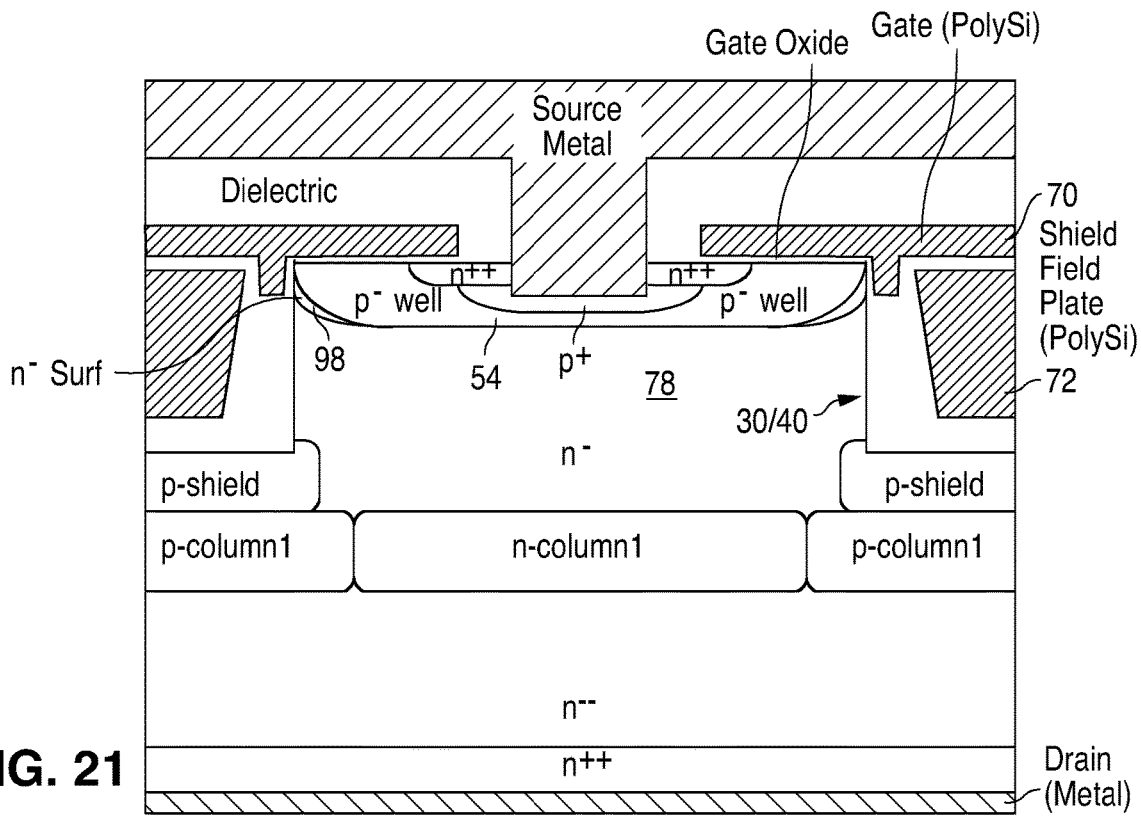
Figure 22:
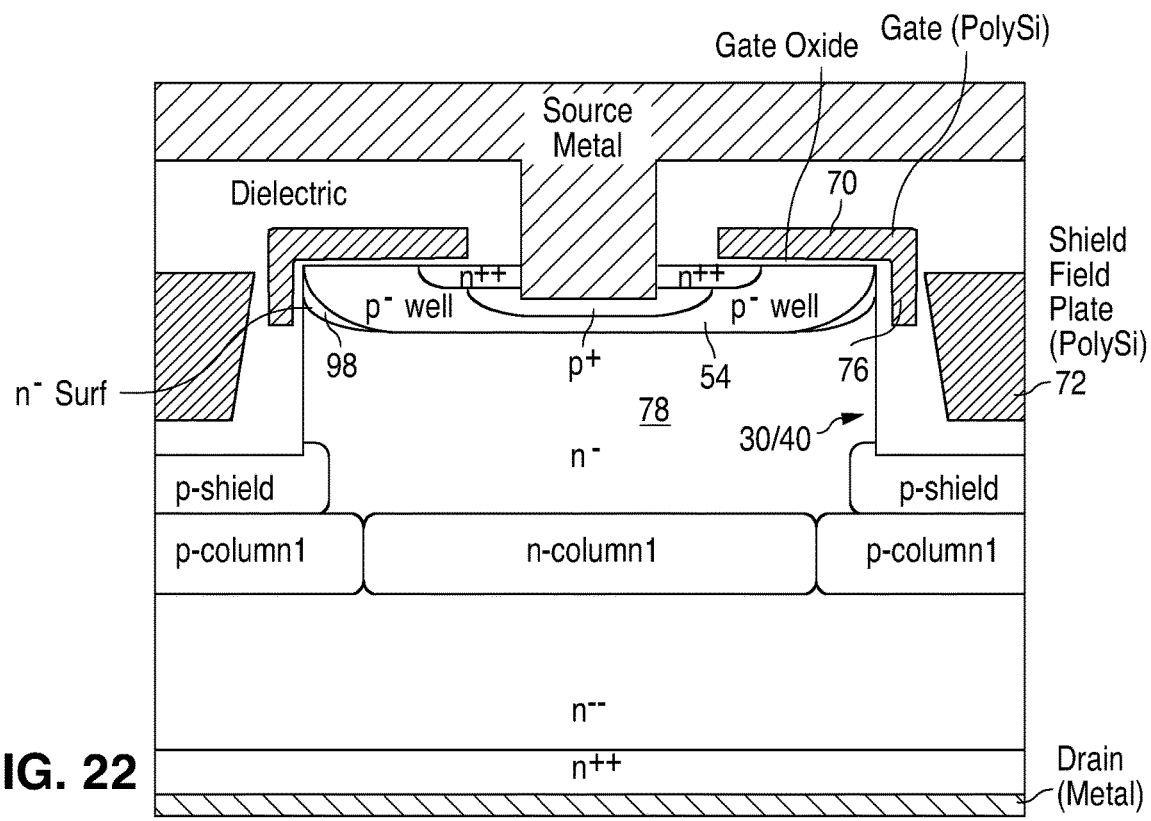

FIGS. 21 and 22 show embodiments with the p-well region 54 adjoining the trench 30/40 sidewall so there is no surface of the n-drift region 78 directly under the gate 70. This device has a longer composite lateral and vertical channel where a portion of the channel is planar and another portion is vertical. The horizontal and vertical portions of the gate 70 are both used to invert the region in the p-well 54. This structure reduces the gate-drain capacitance and reduces the cell pitch, while also reducing the specific on-resistance. The devices of FIGS. 21 and 22 have a longer channel length without increasing the active surface area. These devices can have a shallower junction depth and are able to provide a lower channel leakage current and a lower saturation current as well as a wider safe operation area (SOA). The longer channel may also lower the gain of the parasitic NPN transistor to improve the ruggedness of the device by preventing secondary breakdown. The vertical field plate 72 may be connected to the source metal layer 60 or to the gate 70 or floating.

FIG. 22 shows the gate 70 not overlapping the field plate 72 for reduced capacitance.

In other embodiments, the gate of the vertical MOSFETs may be a trenched gate, such as shown in FIG. 10, and a separate field plate 72 surrounds the cell, including the trenched gate. The trenched gate may be formed as a strip or form a closed gate. The trenched gate would then invert a vertical channel to conduct a vertical current.

Figure 23A:
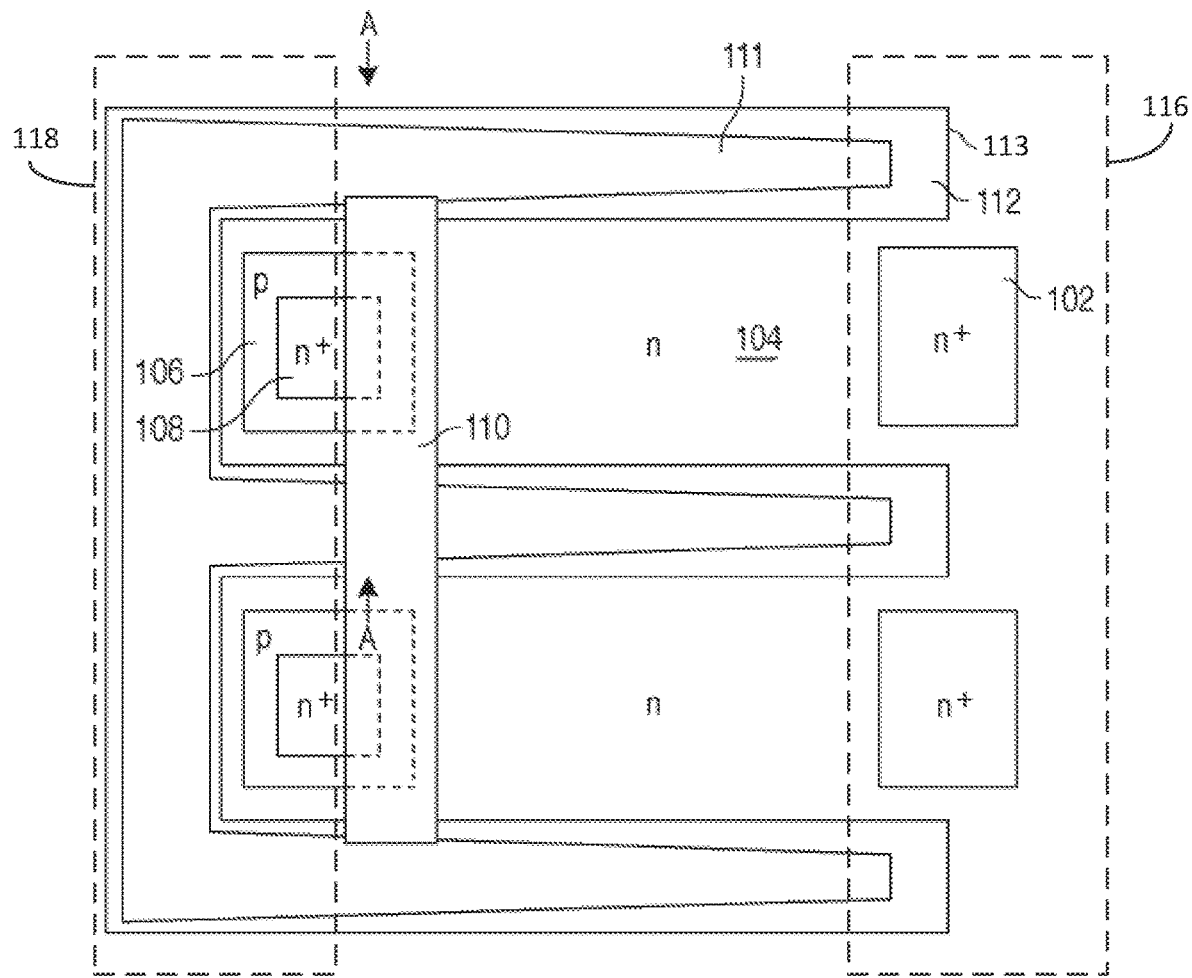
FIG. 23A is a top down view of a lateral MOSFET using a trench with tapered oxide.
Figure 23B:
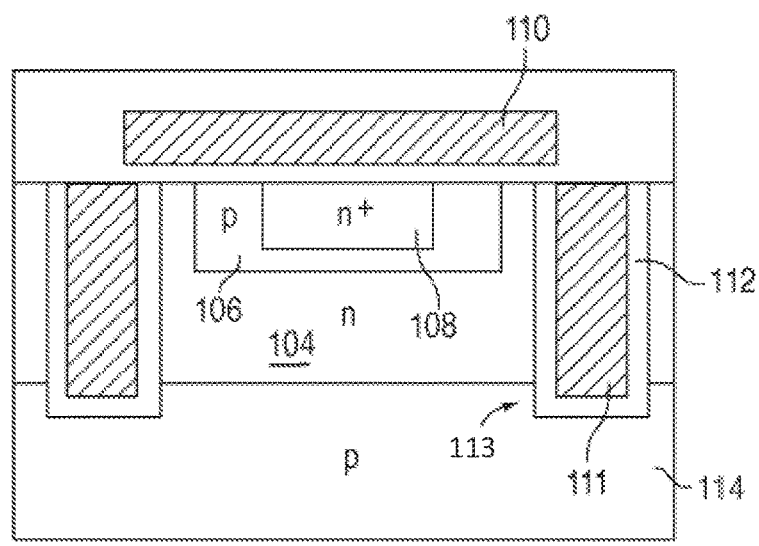
FIG. 23B is a cross-sectional view of the MOSFET of FIG. 23A along line A-A.

FIG. 23A is a top down view of two cells of a lateral MOSFET, and FIG. 23B is a cross-sectional view of the MOSFET along line A-A in FIG. 23A, showing a portion of a single cell. All cells are connected in parallel. The MOSFET is adapted from the MOSFET described in U.S. Pat. No. 7,704,842, to Richard Blanchard, incorporated herein by reference. The prior art MOSFET is modified to have the tapered oxide.

In FIGS. 23A and 23B, the lateral MOSFET includes an n+ drain 102, an n− drift region 104, a p-body region 106, an n+ source region 108, an insulated gate 110 overlying an area of the p-body region 106 for inverting that area to create a conductive channel, and trenches 113 containing conductive polysilicon 111 that run along the n− drift region 104. The polysilicon 111 in the trenches 113 is connected to the gate 110. A thermally grown oxide 112 lines the trenches 113. The substrate 114 is a p-type.

In one embodiment, a high voltage is applied to the n+ drain regions 102 by an overlying first electrode 116, and the n+ source region 108 and p-body region 106 are coupled to a low voltage by an overlying second electrode 118, such as to one terminal of a load where the other terminal of the load is connected to ground. When the gate 110 is sufficiently positively biased, current flows between then source region 104 and the n+ drain region 102 via the channel.

In the on-state of the MOSFET, the positively biased polysilicon 111 in the trenches 113 accumulates electrons along the walls of the trenches 113 in the drift region 104 to reduce the effective resistance of the drift region 104 to reduce the overall on-resistance of the MOSFET.

When the MOSFET is off, such as when the gate 110 and polysilicon 111 are connected to ground, there is a high voltage across the drain region 102 and the grounded polysilicon 111 near the drain region 102. Accordingly, the oxide 112 along the trench 113 is made to be thicker as the trench 113 approaches the drain 102 to withstand the high voltage. The oxide 112 can be made thin near the source region 108. A thinner oxide more efficiently accumulates electrons along the drift region 104 so is desirable.

The tapered oxide 112 is formed using a tilted nitrogen implant that causes a higher concentration of silicon nitride to form nearer the source region 108. Such tilting may be respect to the top surface of the wafer and with respect to the direction of the trench 113, so that the implant is generally directed towards the left end of the trenches 113. Multiple tilt angles or a continuous tilt variation may be used.

Therefore, a higher breakdown voltage is achieved with the thicker oxide 112, while efficiency and on-resistance are improved by the thinner oxide 112.

Any of the disclosed features can be combined in any combination in a MOSFET, IGBT, or other vertical device to achieve the particular benefits of that feature for a particular application.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor device comprising:
   a silicon-containing semiconductor material having a top surface;
   a first trench etched into the top surface to a first depth, the first trench having sidewalls;
   a tapered silicon dioxide layer, the tapered silicon dioxide layer comprising portions of the sidewalls of the trench that have been converted to the tapered silicon dioxide layer due to a portion of the silicon-containing semiconductor material being consumed by the tapered silicon dioxide layer, wherein there is greater consumption of the silicon-containing semiconductor material near a bottom of the first trench compared to near a top of the trench, the tapering of the silicon dioxide layer being formed without etching the silicon dioxide layer;

a conductive material at least partially filling the first trench;

a first electrode overlying the silicon-containing semiconductor material; and a second electrode, wherein current is conducted between the first electrode and second electrode when the device is turned on.

2. The device of claim 1 wherein the tapered silicon dioxide layer near a bottom of the trench is substantially thicker than near a top of the trench.

3. The device of claim 2 wherein the conductive material forms a vertical gate of a vertical transistor.

4. The device of claim 1 wherein the conductive material forms a vertical gate of a lateral transistor.

5. The device of claim 1 wherein the conductive material forms a field plate of a vertical transistor.

6. The device of claim 1 wherein the tapered silicon dioxide layer has physical characteristics associated with forming a tapered silicon nitride layer along the sidewalls, which increases from the bottom of the first trench to the top of the first trench, followed by thermally growing the tapered silicon dioxide layer on the tapered silicon nitride layer.

7. The device of claim 1 wherein the tapered silicon dioxide layer comprises a stepped silicon dioxide layer taper along the sidewalls.

8. The device of claim 1 wherein the tapered silicon dioxide layer comprises a substantially smooth silicon dioxide layer taper along the sidewalls.

9. The device of claim 1 wherein the second electrode contacts a bottom surface of the substrate, and wherein the conductive material within the first trench forms a field plate in a vertical transistor.

10. The device of claim 1 wherein the second electrode contacts a bottom surface of the substrate, and wherein the conductive material within the first trench forms a gate in a vertical transistor.

11. The device of claim 1 wherein the second electrode contacts a bottom surface of the substrate, and wherein the conductive material within the first trench forms a field plate in a vertical transistor, and the field plate is electrically connected to the first electrode.

12. The device of claim 1 wherein the second electrode contacts a bottom surface of the substrate, and wherein the conductive material within the first trench forms a field plate in a vertical transistor, and the field plate is floating.

13. The device of claim 1 wherein the second electrode contacts a bottom surface of the substrate, wherein the conductive material within the first trench forms a field plate in a vertical transistor, and wherein the field plate is electrically connected to a gate.

14. The device of claim 1 wherein the first trench has angled sidewalls.

15. The device of claim 1 wherein the first trench has substantially parallel sidewalls.

16. The device of claim 1 wherein the conductive material partially fills the first trench to form a first conductive material portion, the device further comprising:

silicon dioxide over the first conductive material portion; and additional conductive material filling the first trench over the silicon dioxide to form a second conductive material portion insulated from the first conductive material portion, wherein the second conductive material portion forms a gate for a vertical transistor, and the first conductive material portion forms a field plate.

17. The device of claim 1 wherein the silicon-containing semiconductor material has a first conductivity type, the device further comprising:

a well region, having a second conductivity type, in the silicon-containing semiconductor material; and a first region, having the first conductivity type, in the well region, wherein a channel region is formed between an edge of the first region and an edge of the well region, wherein the semiconductor device is a vertical transistor.

18. The device of claim 1 wherein the conductive material at least partially filling the first trench is a gate that inverts a region when electrically biased to cause a current to flow between the first electrode and the second electrode.

19. A semiconductor device comprising:

a silicon-containing semiconductor material having a top surface;

a first trench etched into the top surface to a first depth, the first trench having sidewalls;

a tapered silicon dioxide layer formed over the sidewalls, the tapered silicon dioxide layer being thermally grown over the sidewalls so as to convert a portion of the silicon-containing semiconductor material to the tapered silicon dioxide layer, the tapering of the silicon dioxide layer being formed without etching the silicon dioxide layer;

a conductive material at least partially filling the first trench;

a first electrode overlying the silicon-containing semiconductor material; and a second electrode, wherein current is conducted between the first electrode and second electrode when the device is turned on, wherein the second electrode is formed overlying the silicon-containing semiconductor material, and the device is a lateral MOSFET including a source region and a drain region, wherein the first trench is formed along a drift region between the source region and the drain region, and wherein the silicon dioxide proximate the drain region is substantially thicker than the silicon dioxide proximate the source region.

* * * * *